United States Patent [19]

Kubotera et al.

[11] 4,297,436

[45] Oct. 27, 1981

[54] METHOD FOR PRODUCING A MULTILAYER PRINTING PLATE

[75] Inventors: Kikuo Kubotera; Masamichi Sato; Akira Kashiwabara; Kotaro Sato, all of Asaka, Japan

[73] Assignee: Fuji Photo Film Co., Ltd., Minami-ashigara, Japan

[21] Appl. No.: 914,704

[22] Filed: Jun. 12, 1978

Related U.S. Application Data

[63] Continuation of Ser. No. 645,049, Dec. 29, 1975, abandoned.

[30] Foreign Application Priority Data

Dec. 26, 1974 [JP] Japan .................................. 49/443

[51] Int. Cl.$^3$ ........................... G03F 7/02; G03C 5/00
[52] U.S. Cl. .................................. 430/310; 101/454; 101/458; 101/459; 156/643; 430/299; 430/302; 430/323
[58] Field of Search ................. 96/33, 36, 38.3, 29 L, 96/36.3; 101/454, 458, 459; 430/302, 310, 323, 299; 156/643

[56] References Cited

U.S. PATENT DOCUMENTS

| | | | |
|---|---|---|---|
| T862,018 | 5/1969 | Abbot | 96/33 |
| 2,584,317 | 2/1952 | Aller | 96/33 |
| 2,726,200 | 12/1955 | Holsapple | 96/36 X |
| 2,907,656 | 10/1959 | Geese | 96/33 |
| 3,479,182 | 11/1969 | Chu | 96/33 |
| 3,577,920 | 5/1971 | London et al. | 101/459 |
| 3,600,166 | 8/1971 | Sieg et al. | 96/36.3 |
| 3,901,706 | 8/1975 | Tsuboi et al. | 96/33 |
| 3,929,481 | 12/1975 | Kubotera et al. | 96/29 L |
| 3,960,560 | 6/1976 | Sato | 96/36 |
| 4,113,486 | 9/1978 | Sato | 96/36 |

*Primary Examiner*—Edward C. Kimlin
*Attorney, Agent, or Firm*—Sughrue, Rothwell, Mion, Zinn and Macpeak

[57] ABSTRACT

A method for producing a multilayer printing plate comprising image-wise exposing and developing a light-sensitive printing plate material which comprises a support having an oleophilic surface having a hydrophilic metal layer thereon, the hydrophilic metal layer having thereon at least one silver halide emulsion layer either directly or on at least one subbing layer on the hydrophilic metal layer, to form a silver image resist image corresponding to the image-wise exposure by subjecting the printing plate material to a process including baking, removing the hydrophilic metal layer at non-resist image areas to uncover the oleophilic surface thereunder, and removing the resist image, or a method for producing a multilayer printing plate comprising image-wise exposing and developing a light-sensitive printing plate material which comprises a support having a hydrophilic surface having thereon at least one silver halide emulsion layer either directly or on at least one subbing layer on the hydrophilic surface to form a silver resist image corresponding to the image-wise exposure by subjecting the printing plate material to a process including baking, providing an oleophilic metal layer on the hydrophilic surface at the non-resist image area, and removing the resist image.

55 Claims, 6 Drawing Figures

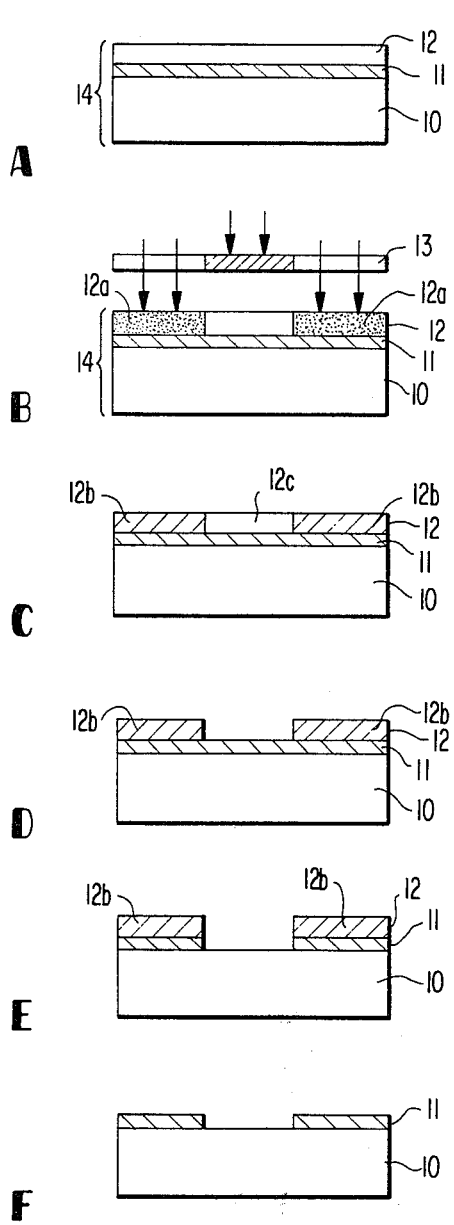
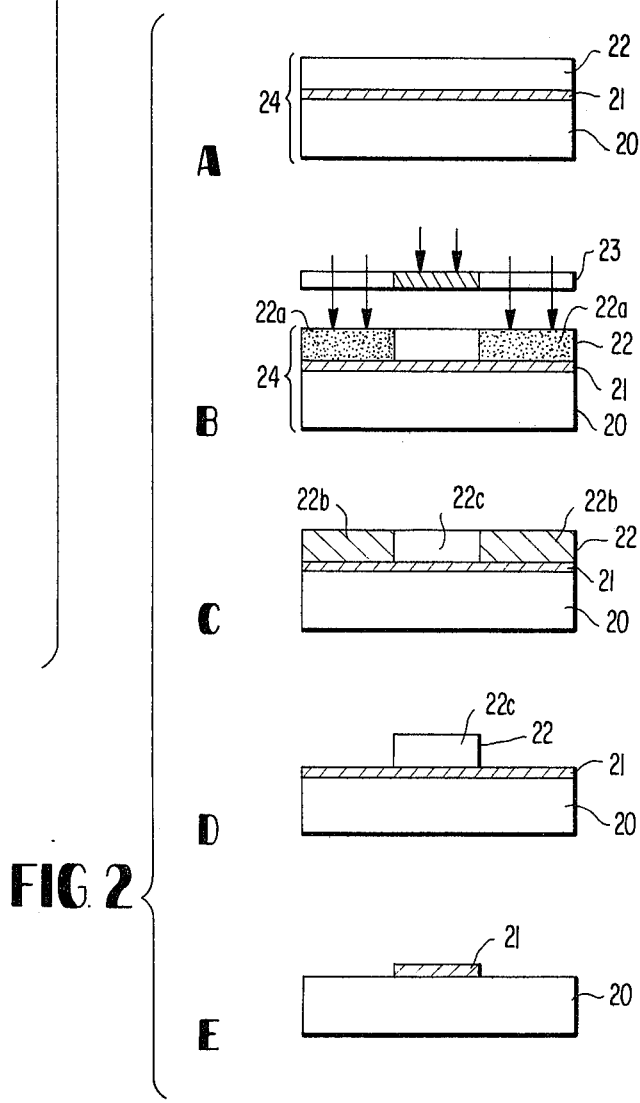
FIG. 1
FIG. 2

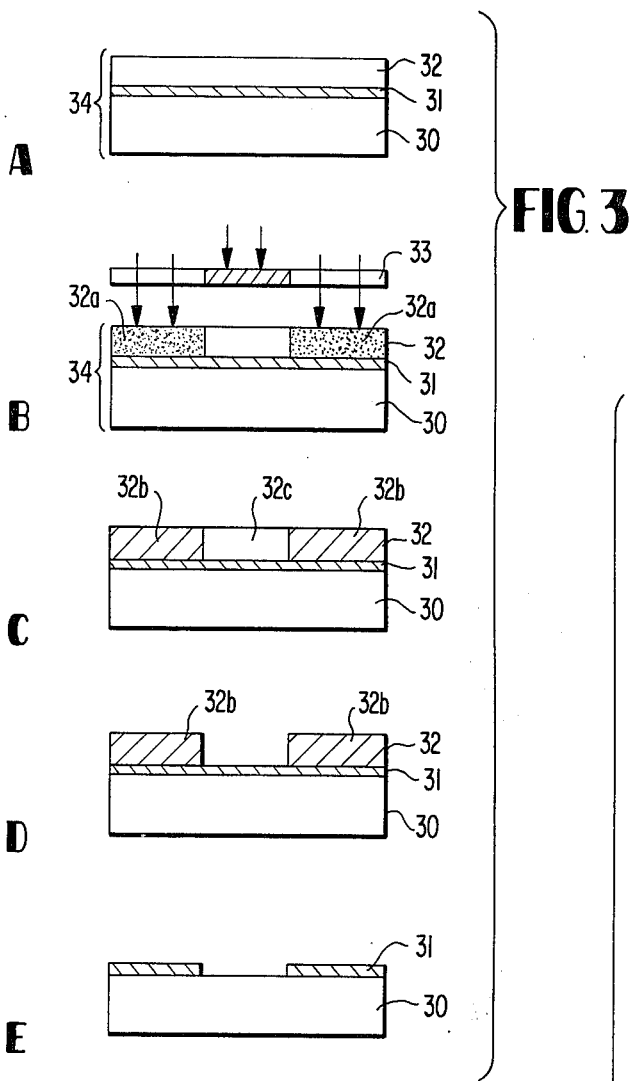
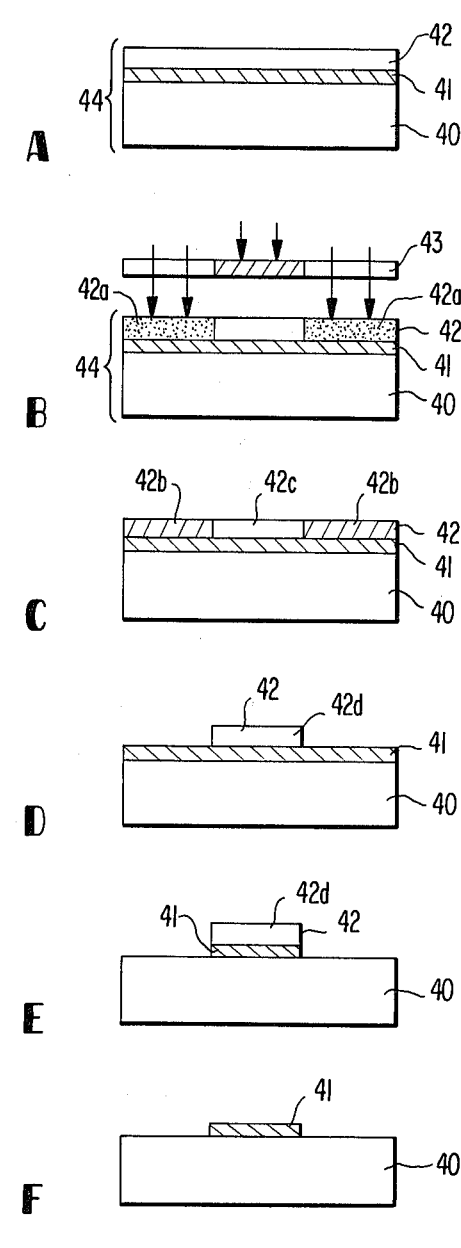
FIG. 3
FIG. 4

METHOD FOR PRODUCING A MULTILAYER PRINTING PLATE

This is a Continuation of application Ser. No. 645,049, filed Dec. 29, 1975, now abandoned.

BACKGROUND OF THE INVENTION

1. Field of the Invention

The present invention relates to a method for producing a multilayer printing plate. More particularly, it relates to a method for producing a multilayer printing plate of excellent quality having high accuracy using a light-sensitive printing plate material having high light sensitivity comprising a silver halide emulsion.

2. Description of the Prior Art

Heretofore, bimetal plates and trimetal plates have often been utilized as multilayer printing plates. These multilayer printing plates comprise two or more metals, and the metal at the image area is different from the metal at the nonimage area. Further, these metals have differing receptivities to oil (ink) and water (dampening water) to provide a printing plate comprising an image area and non-image area. Various types of multilayer printing plates are known, depending on the combinations of metals, processes for printing plate making, and the printing plate structure (e.g., litho-relief, deep etch). The most typical metal for the image area (oleophilic metal) is copper, though brass, iron and silver, etc. have also been used. Typical metals for the non-image area (hydrophilic metal) are chromium, aluminum, nickel and stainless steel, etc.

In practice, a bimetal copper-chromium combination plate has been widely used. The copper-chromium bimetal printing plate is produced by image-wise exposing and developing a light-sensitive compositon coated on the chromium metal layer of a laminate of chromium and copper to form an etch resistant relief image on the chromium metal layer, removing the chromium metal layer at the non-relief image area to uncover the copper metal layer using an etching solution, and removing the refief image.

Examples of trimetal plates are iron-copper-chromium, zinc-copper-chromium, aluminum-copper-chromium, stainless steel-copper-chromium, etc.

However, light-sensitive compositions such as diazo resins, chromium resists (e.g., dichromate-gelatin, dichromate-polyvinyl alcohol, dichromate-gum arabic, etc.), etc., used for the production of these bimetal or trimetal printing plates have an extremely low sensitivity so that the plate making time is long and, accordingly, the cost is high.

SUMMARY OF THE INVENTION

It is, therefore, an object of the present invention to provide a method for producing a multilayer printing plate using a high speed light-sensitive printing plate material comprising a silver halide emulsion.

Another object of the present invention is to provide a multilayer printing plate easily and rapidly.

The above-described objects of the present invention can be attained by image-wise exposing and developing a light-sensitive material which comprises a support having an oleophilic surface having a hydrophilic metal layer thereon, the hydrophilic metal layer having thereon at least one silver halide emulsion layer either directly or on at least one subbing layer on the hydrophilic metal layer, forming a resist image corresponding to the image-wise exposure by subjecting the printing plate material to a process including baking, removing the hydrophilic metal layer at the non-resist image area to uncover the oleophilic surface thereunder, and removing the resist image.

Also, the above-described objects of the present invention can be attained by image-wise exposing and developing a light-sensitive printing plate material which comprises a support having a hydrophilic surface having thereon at least one silver halide emulsion layer, either directly or on at least one subbing layer, on the hydrophilic surface, forming a resist image corresponding to the image-wise exposure by subjecting the printing plate material to a process including baking, forming an oleophilic metal layer on the hydrophilic surface at the nonresist image area, and removing the resist image.

BRIEF DESCRIPTION OF THE DRAWINGS

FIGS. 1 through 6 are side sectional views of printing plate materials of various embodiments of the present invention.

DETAILED DESCRIPTION OF THE INVENTION

Figure 5:
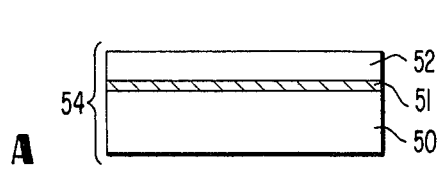
Figure 5:
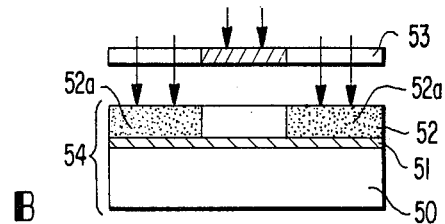
Figure 5:
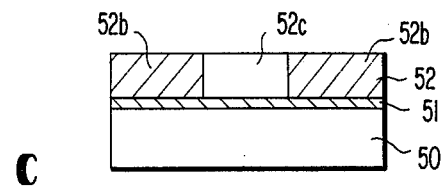
Figure 5:
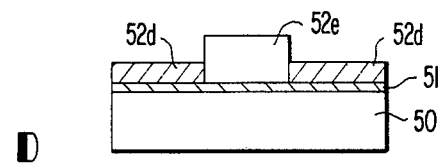
Figure 5:
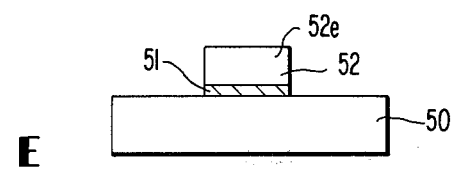
Figure 5:
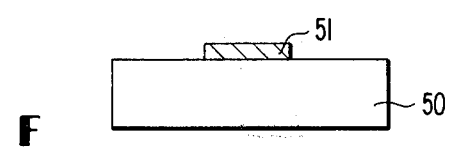

Two important things are to be noted in the method of the present invention.

Firstly, non-reactivity between the silver halide photographic emulsion and the metal layer is required. When a silver halide emulsion is contacted with most metals, the silver halide is often reduced to silver due to the difference in ionization potentials between silver and the metals, whereby the silver halide loses light-sensitivity or fog nuclei are formed therein. Further, when a silver halide emulsion is contacted with a metal having a high ionization potential, the silver halide is reduced to silver, and, at the same time, the metal having a high ionization potential is etched. This phenomenon occurs even when a hydrophilic colloid layer (e.g., gelatin) is present between the silver halide emulsion layer and the metal layer.

Heretofore, multi-metal layer printing plates which have involved a hydrophilic metal layer have comprised aluminum, chromium, nickel, and stainless steel, etc. Of these, only chromium, nickel, stainless steel (the term "stainless steel" as used herein designates an alloy which contains 4% or more by weight of at least two or iron, chromium and nickel, and may contain less than 4% by weight of at least one metal other than iron, chromium and nickel, e.g., carbon and silicon) and noble metals (gold, ruthenium, rhodium, palladium, iridium and platinum) have been found not to reduce a gelatin silver halide emulsion.

Secondly, it has been found that when a processed silver halide emulsion layer is heated (hereinafter designated as "baking processed" or "baked"), a resist image which prevents water from penetrating is easily formed.

Suitable examples of hydrophilic metals which comprise non-image areas of a light-sensitive printing plate material which can be used in the method of the present invention are chromium, nickel, stainless steel and noble metals.

Suitable examples of oleophilic metals which comprise image areas and serve as a support are well known, e.g., copper, zinc, iron, silver, and brass (hereinafter "brass" designates an alloy which mainly comprises copper and not more than about 45 wt% zinc); however it should be clear from the scope of the present invention that the oleophilic metals are not limited to those described above.

Further, a multilayer plate which comprises a support such as a metal different from the above-described oleophilic metals, a ceramic, or a high melting point polymer having thereon a layer of the above-described oleophilic metals can be used instead of the oleophilic metal which serves as a support, depending on mechanical strength, hardness, melting point, workability, and cost. A layer of oleophilic metal about 0.1 to about 50μ, more preferably about 0.2 to about 10μ, is conveniently used. Examples of such a different metal are iron, aluminum, zinc, etc. Examples of such ceramics are alumina porcelain, ferrite porcelain, etc. Examples of high melting point polymers are poly(pyromellitic acid-p-phenylenediamineimide), poly(p-oxybenzoate), etc.

Suitable examples of combinations of metals for the multilayer plate of the present invention which has a hydrophilic metal layer on the top are copper-chromium, iron-copper-chromium, zinc-copper-chromium and aluminum-copper-chromium, etc., where chromium is used as the hydrophilic metal. In these plates copper is used as an image area metal and chromium as a non-image area metal. A chromium plated copper plate and a copper plated iron or aluminum plate further plated with chromium on the copper layer can be advantageously used. These plates fall in one category in that all plates include a combination of copper-chromium. Iron, aluminum, or zinc serve as a mere support and have no influence on the surface of the plate. One would generally use iron, aluminum or zinc when low cost is desired in a trimetallic plate, with the further advantage that aluminum or zinc are relatively light.

The chromium layer is provided by depositing chromium on the copper layer using electroplating, chemical plating, vacuum deposition, sputtering, ion plating or the like. The thickness of the chromium layer can range from about 0.1 to about 10μ, more preferably from 0.2 to 5μ. If the thickness is too small, the life of the printing plate is small, while if the thickness is too large, the etching takes a long time and the problem of side etching arises. In Embodiment 6 of the present invention, later described, the thickness of the chromium layer can be not less than about 0.1μ, but there is no upper limit; however, in practice a thickness of not more than about 20μ is employed, and more preferably a thickness from 0.2 to 5μ is employed. Hydrophilic metals other than chromium such as nickel and stainless steel can be provided in the same manner as chromium and thickness ranges as for the chromium layer can be employed.

The method of the present invention is characterized by the use of a light-sensitive printing plate material which comprises the above-described hydrophilic metal layer having thereon at least one silver halide emulsion layer, either directly or on at least one subbing layer, on the hydrophilic metal layer.

The silver halide emulsion used in the present invention is conventional in the photographic arts. It can be obtained by dispersing one or more silver halides in a water-soluble binder. The weight ratio of silver halide to the water-soluble binder (dry weight) is preferably about 1:6 to about 6:1, though this is not limitative. Illustrative silver halides are silver chloride, silver bromide, silver iodide, silver chlorobromide, silver bromoiodide, silver chloroiodide, silver chlorobromoiodide, mixtures thereof, etc. While any silver halide emulsion can be used, emulsions having silver halide grains smaller than about 3μ are preferred to obtain higher resolving power. The grain size of the emulsion is not limited to such sizes as these are merely preferred.

A most typical silver halide emulsion used is an emulsion which contains about 90 mol% or more silver bromide (preferably containing not more than about 5 mol% silver iodide) and which contains silver halide grains of a mean grain size of not more than about 3μ, more preferably not more than about 1μ, and in which the weight ratio of silver halide to the water-soluble binder is about 1:4 to about 6:1.

Another example of a typically used silver halide emulsion is a lith type emulsion which contains about 50 mol% or more (preferably 70 mol% or more) silver chloride and which contains silver halide grains of a mean grain size of not more than about 3μ, and in which the weight ratio of silver halide to the water-soluble binder is about 1:4 to about 6:1.

Examples of water-soluble binders include gelatin (alkali treated gelatin, acid treated gelatin, enzyme treated gelatin, etc.), colloidal albumin, casein, cellulose derivatives (e.g., carboxymethyl cellulose, hydroxyethyl cellulose, etc.), saccharide derivatives (e.g., agar-agar, sodium alginate, starch derivatives, etc.), synthetic hydrophilic colloids (e.g., polyvinyl alcohol, poly-N-vinyl pyrrolidone, polyacrylic acid copolymers, polyacrylamide, derivatives thereof, etc.). If desired, a compatible mixture of two or more of these binders can be used. Of these, a most preferred binder is gelatin, which can be replaced, partly or completely, by a synthetic high molecular weight substance, by a so-called gelatin derivative (prepared by processing gelatin with a compound having a group capable of reacting with the functional groups contained in the gelatin molecule, i.e., amino groups, imino groups, hydroxy groups or carboxy groups), or by a graft polymer prepared by grafting a molecular chain of some other high molecular weight substance onto the gelatin. Suitable compounds for preparing the gelatin derivatives are isocyanates, acid chlorides and acid anhydrides as described in U.S. Pat. No. 2,614,928, acid anhydrides as described in U.S. Pat. No. 3,118,766, bromoacetic acids as described in Japanese Pat. No. 5514/64, phenyl glycidyl ethers as described in Japanese Pat. No. 21845/67, vinyl sulfone compounds as described in U.S. Pat. No. 3,132,945, N-allylvinylsulfonamides as described in British Pat. No. 861,414, maleinimide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Pat. No. 26845/67, acid esters as described in U.S. Pat. No. 2,763,639, alkanesultones as described in British Pat. No. 1,033,189, etc. Descriptions of suitable branched high polymers grafted onto gelatin are given in U.S. Pat. Nos. 2,763,625; 2,831,767; 2,966,884; *Polymer Letters*, 5, 595 (1967), *Phot. Sci. Eng.*, 9, 148 (1965), *J. Polymer Sci. A*-1, 9, 3199 (1971), and the like.

Homopolymers or copolymers of compounds which are generally called vinyl monomers, such as acrylic acid, methacrylic acid, the ester, amide and nitrile derivatives thereof, styrene, etc., are widely used for grafting to gelatin. Hydrophilic vinyl polymers having some compatibility with gelatin, such as homopolymers or copolymers of acrylic acid, acrylamide, methacrylamide, hydroxyalkyl acrylates, hydroxyalkyl methacrylates, etc., i.e., copolymers of these materials among themselves and copolymers of these materials with other comonomers, are particularly preferred.

These silver halide emulsions are advantageously optically sensitized with conventional optical sensitizers such as the cyanine dyes and merocyanine dyes as described in U.S. Pat. Nos. 1,346,301; 1,846,302; 1,942,854; 1,990,507; 2,493,747; 2,739,964; 2,493,748; 2,503,776; 2,519,001; 2,666,761; 2,734,900 and 2,739,149; and British Pat. No. 450,058.

The silver halide emulsion is exposed to electromagnetic radiation to which the silver halide emulsion is sensitive, e.g., visible, ultraviolet, electron beam, X-ray, etc., radiation. With the optically sensitized photographic light-sensitive materials, it is convenient to use irradiation mainly having a wavelength corresponding to the optically sensitized region of the emulsion as the irradiation for exposing the emulsion layer. That is, the silver halide emulsion can be exposed to light having any wave length or wave length region so long as the exposure radiation overlaps the optically sensitized wave length region of from about 400 to about 750 nm. If desired, the silver halide emulsion can be exposed to light having any wave length or wave length region which overlaps the inherent sensitivity region (e.g., about 290 to about 450 nm) of the silver halide.

The silver halide emulsion is advantageously chemically sensitized with a gold salt such as a chloroaurate, gold (III) chloride, etc., as described in U.S. Pat. Nos. 2,399,083, 2,540,085, 2,597,856 and 2,597,915. Also, the emulsion can be chemically sensitized with salts of noble metals such as platinum, palladium, iridium, rhodium, ruthenium, etc., as described in U.S. Pat. Nos. 2,448,060; 2,540,086; 2,566,245; 2,566,263 and 2,598,079. Further, the emulsion can be chemically sensitized with sulfur compounds which can form silver sulfide by reacting with silver halide as described in U.S. Pat. Nos. 1,574,944; 2,410,689; 3,189,458 and 3,501,313. Furthermore, a thiopolymer as described in U.S. Pat. No. 3,046,129 can advantageously be incorporated in the emulsion. In addition, the emulsion can be chemically sensitized with tin (I) salts, amines and other reducing substances as described in U.S. Pat. Nos. 2,487,850; 2,518,698; 2,521,925; 2,521,926; 2,694,637; 2,983,610 and 3,201,254.

The silver halide emulsion can contain various conventional additives to prevent the light-sensitive printing plate material from reducing in sensitivity or undergoing fogging during manufacturing, storage or processing, such as 4-hydroxy-6-methyl-1,3,3a, 7-tetraazaindene, 3-methyl-benzothiazole, 1-phenyl-5-mercaptotetrazole, and many other known compounds such as heterocyclic compounds, mercury containing compounds, mercaptans, metal salts, etc. Descriptions of such compounds are given, for example, in C.E.K. Mees, *The Theory of the Photographic Process*, 3rd Edition, pp. 344–349, Macmillan Co., New York (1966) and U.S. Pat. Nos. 1,758,576; 2,110,178; 2,131,038; 2,173,628; 2,697,040; 2,304,962; 2,324,123; 2,394,198; 2,444,605-8 2,566,245; 2,694,716; 2,697,099; 2,708,162; 2,728,663-5, 2,476,536; 2,824,001; 2,843,491; 3,052,544; 3,137,577; 3,220,839; 3,226,231; 3,236,652; 3,251,691; 3,252,799; 3,287,135; 3,326,681; 3,420,668 and 3,662,339; British Pat. Nos. 893,428; 403,789; 1,173,609 and 1,200,188; etc.

The emulsion can contain light-absorbing dyes as described in U.S. Pat. Nos. 2,527,583; 2,611,696; 3,247,127; 3,260,601, etc.

The emulsion can advantageously be hardened with a conventional hardening agent for hydrophilic colloids, such as aldehydes (e.g., formaldehyde, glutaraldehyde, etc.); dialdehydes or sodium bisulfate adducts thereof such as $\beta$-methylglutaraldehyde bis(sodium hydrogen sulfate) addition products; ketones such as diacetyl, cyclopentanedion, etc.; methanesulfonic acid bisester; compounds containing a reactive halogen such as bis(2-chloroethylurea), 2-hydroxy-4,6-dichloro-1,3,5-triazine, etc., as described in U.S. Pat. Nos. 3,288,775 and 2,732,303 and British Pat. Nos. 974,723 and 1,167,207; compounds containing a reactive olefin group such as divinyl sulfone, 5-acetyl-1,3-diacryloylhexahydro-1,3,5-triazine, etc., as described in U.S. Pat. Nos. 3,635,718 and 3,232,763 and British Pat. No. 994,869; N-methylol compounds such as N-hydroxymethylphthalimide, etc., as described in U.S. Pat. Nos. 2,732,316 and 2,586,168; isocyanates as described in U.S. Pat. No. 3,103,437; aziridine compounds such as bisaziridinecarboxyamide and trimethylenebis(1-aziridinecarboxyamide), etc., as described in U.S. Pat. Nos. 3,017,280 and 2,983,611; acid derivatives as described in U.S. Pat. Nos. 2,725,294 and 2,725,595; carbodiimide compounds as described in U.S. Pat. No. 3,100,704; epoxy compounds as described in U.S. Pat. No. 3,091,537; isoxazole compounds as described in U.S. Pat. Nos. 3,321,313 and 3,543,292; halogenocarboxyaldehydes such as mucochloric acid, mucobromic acid, etc.; dioxane derivatives such dihydroxydioxane, dichlorodioxane, etc.; inorganic hardening agents such as chromium alum, zirconium sulfate, etc.; precursors of the above-described compounds such as alkali metal bisulfite-aldehyde adducts; methylol derivatives of hydantoin, primary aliphatic nitroalcohols, etc.

The silver halide emulsion can contain one or more conventional surface active agents. These surface active agents are used as coating aids; however, on some occasions, they can be used for other purposes such as emulsification, sensitizing, improving photographic characteristics, preventing static charging, preventing adhesion, etc. Examples of surface active agents which can be used in the method of the prevent invention are natural surface active agents such as saponin, etc., nonionic surface active agents such as alkylene oxides, glycerin compounds, glycidol compounds, etc., cationic surface active agents such as higher alkylamines, quaternary ammonium salts, pyridine and other heterocyclic compounds, phophonium or sulfonium compounds, etc., anionic surface active agents containing acidic groups such as carboxylic acid, sulfonic acid, phosphoric acid, sulfuric ester, phosphoric ester groups, etc., amphoteric surface active agents such as amino acids, aminosulfonic acids, sulfuric or phosphoric esters of amino-alcohols, etc. Some of these surface active agents are described in U.S. Pat. Nos. 2,271,623; 2,240,472; 2,288,226; 2,739,891; 3,068,101; 3,158,484; 3,201,253; 3,210,191; 3,294,540; 3,415,649; 3,441,413; 3,442,654; 3,475,174 and 3,545,974, West German Pat. (OLS) No. 1,942,665; British Pat. Nos. 1,077,317 and 1,198,450; R. Oda, et al, *Kaimen Kasseizai no Gosei to Sono Oyo (Synthesis and Application of Surface Active Agents)*, Maki Shoten (1964); A. W. Perry, *Surface Active Agents*, Interscience Publication Inc. (1958); J. P. Sisley, *Encyclopedia of Surface Active Agents*, Vol. 2, Chemical Publishing Co. (1964), etc.

The silver halide emulsion is coated on the hydrophilic metal layer directly or after adding the above-described surface active agent and other additives, if desired. The silver halide emulsion layer preferably has a thickness of about 0.3μ to about 20μ (dry basis) and can be coated as one or as two more layers on the hydrophilic metal layer. When two or more layers of the silver halide emulsion are used on the hydrophilic metal layer, the total thickness is less than about 20μ.

If desired, a conventional backing layer, antihalation layer, interlayer, uppermost layer (e.g., protective layer, etc.), subbing layer, and the like can be provided on the support, the hydrophilic layer or on the emulsion layer.

The subbing layer often used in the present invention is a layer which intimately adheres to both the hydrophilic metal layer and the silver halide emulsion layer. When the hydrophilic metal layer differs highly in properties from the silver halide emulsion layer, two or more subbing layers can be employed, the subbing layers being selected so that they adhere well to the layer to which they are closest and, of course, to each other. Examples of suitable subbing layers are described in Japanese Pat. Nos. 5509/64, 2597/69 and 11616/71; U.S. Pat. No. 3,492,122; West German Pat. (OLS) No. 2,001,727, etc. A suitable thickness for the subbing layer ranges from about 0.05 to about 3μ, more preferably, from about 0.1 to 1μ. Also, a subbing layer formed by providing a thin polyvinyl acetate layer (preferably at a dry thickness of about 0.1 to about 1μ) and bringing the surface into contact with an aqueous alkaline solution, such as an aqueous solution of sodium hydroxide, for saponification can also be used.

The silver halide emulsion layer, subbing layer, etc., can be provided using conventional coating methods such as dip coating, air knife coating, curtain coating, hopper type extrusion coating as described in U.S. Pat. No. 2,681,294, etc. If desired, two or more layers can be coated at the same time using a method as described in U.S. Pat. Nos. 2,761,791; 3,508,947; 2,941,898 and 3,526,528.

Formation of a silver image in the silver halide emulsion layer can be effected using conventional photographic processings, that is, by development processing the exposed emulsion layer and, if necessary, fixing. Conventional photo-developing agents which can be used in the method of the present invention for forming silver images are well known in the art, and include developing agents such as the dihydroxybenzenes (e.g., hydroquinone, 2-chlorohydroquinone, 2-bromohydroquinone, 2-isopropylhydroquinone, toluhydroquinone, 2-phenylhydroquinone, 2,3-dichlorohydroquinone, 2,5-dimethylhydroquinone, etc.), the polyhydroxybenzenes (e.g., pyrogallol, catechol, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), the aminophenols (e.g., o-aminophenol, p-aminophenol, o-(methylamino)phenol, p-(methylamino)phenol, p-(benzylamino)phenol, p-(dimethylamino)phenol, 2,4-diaminophenol, etc.), the phenylenediamines (e.g., p-phenylenediamine, N,N-diethyl-p-phenylenediamine, etc.), N-(p-hydroxyphenyl)glycine, ascorbic acid, the 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, pyrazoline, 1-(p-amino-m-methylphenyl)-3-aminopyrazoline, etc.), the compounds described as developing agents in C. E. K. Mees & T. H. James, *The Theory of the Photographic Process*, 3rd Edition, Chapter 13, Macmillan Co., New York (1966), L. F. A. Mason, *Photographic Processing Chemistry*, pp. 16–30, The Focal Press, London (1966), and mixtures thereof. The developer generally possesses a pH of not less than about 8, preferably about 8.5 to 13.0.

The developer can contain, if desired, an alkali agent (e.g., a hydroxide of an alkali metal or ammonium such as sodium hydroxide, potassium hydroxide, ammonium hydroxide, etc., a carbonate such as sodium carbonate, potassium carbonate, etc., a phosphate, borax, sodium metaborate, etc.), a pH-adjusting agent or buffer (e.g., a weak acid such as acetic acid, boric acid, etc., a salt thereof such as sodium acetate, potassium carbonate, sodium carbonate, sodium phosphate, etc., a weak alkali such as methanolamine, ethanolamine, etc., salts thereof, etc.), a development promoting agent (e.g., pyridinium compounds and cationic compounds as described in U.S. Pat. Nos. 2,648,604 and 3,671,247, potassium nitrate, sodium nitrate, condensation products of polyethylene glycol and derivatives thereof as described in U.S. Pat. Nos. 2,533,990; 2,577,127; 2,950,970, nonionic compounds such as polythioethers represented by compounds as described in British Pat. Nos. 1,020,033 and 1,020,032, pyridine, organic amines such as ethanolamine, benzyl alcohol, urea, hydrazines, etc.), a sensitizing agent (e.g., allylthiourea, quaternary ammonium salts, etc.), an antifogging agent (e.g., an alkali bromide, alkali iodide, nitrobenzimidazoles as described in U.S. Pat. Nos. 2,496,940 and 2,656,271 and nitrobenzimidazoles as described in U.S. Pat. No. 2,496,940 and mercaptobenzimidazole, 5-methylbenzotriazole, 1-phenyl-5-mercaptotetrazole, compounds for a rapid developing solution as described in U.S. Pat. Nos. 3,113,864; 3,342,596; 3,295,976, 3,615,522 and 3,597,199, thiosulfonyl compounds as described in British Pat. No. 972,211, phenazine-N-oxides as described in Japanese Pat. No. 41675/71, antifogging agents as described in Kagaku Shashin Binran (Handbook of Scientific Photography), Vol. 2, pp. 29–47, Maruzen, Tokyo (1959), etc.), stain or sludge preventing agents as described in U.S. Pat. Nos. 3,161,513 and 3,161,514, and British Pat. Nos. 1,030,442; 1,144,481 and 1,251,558, an interlayer effect and interlayer effect promoting agent as described in U.S. Pat. No. 3,536,487, etc., a preservative (e.g., a sulfite such as sodium sulfite, potassium sulfite, sodium bisulfite, potassium bisulfite, ammonium bisulfite, etc., hydroxylamine hydrochloride, a formaldehyde-sulfite adduct, an ethanolaminesulfite adduct, etc.), a chelating agent (e.g., EDTA, disodium salt of EDTA, iminodiacetic acid, nitrilotriacetic acid, etc.), a surface active agent, etc.

The fixing agents for the silver halide are conventional and include the generally well known solvents for silver halides, such as a water-soluble thiosulfate (e.g., potassium thiosulfate, sodium thiosulfate, ammonium thiosulfate, etc.), a water-soluble thicyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecandediol, 3,6,9,12-tetrathia-1,14-tetradecanediol, etc.), a water-soluble sulfur-containing organic dibasic acid (e.g., ethylenebisthioglycolic acid, etc.), a water-soluble salt thereof (e.g. potassium ethylenebisthioglycolate, sodium ethylenebisthioglycolate, etc.), and mixtures thereof.

The fixing solution can contain, if desired, conventional additives such as a preservative (e.g., sulfite, a hydrogen sulfite, etc.) a pH-buffer (e.g., boric acid, a borate, etc.), a pH-adjusting agent (e.g., acetic acid, etc.), a chelating agent, and the like.

A silver image is thus formed in the exposed areas, while in the unexposed areas silver halide is removed by a conventional fixing procedure, the binder in the silver halide emulsion layer in these areas remaining intact. Where the silver halide emulsion is reversal-type emulsion or where reversal processing is conducted, the binder remains in exposed areas, whereas a silver image is formed in the unexposed areas. Reversal-type emulsions and reversal-processings are well known in the art.

In the present invention, the optical density of silver image need not necessarily be the same as that required in conventional silver halide photography as the silver image functions only as a medium for converting an emulsion layer into a resist image corresponding to an original image. That is, in conventional photography the optical density of a silver image decreases with reductions in thickness of an emulsion layer to such an extent that it is not practically useful, while in the present invention the thickness of the emulsion layer is such that the emulsion layer is removed according to the original image to form a resist image of the emulsion layer. Therefore, a film thickness as thin as about 1/5 that necessary for obtaining sufficient optical density using an ordinary photographic emulsion is employable (provided that the proportion of silver in the emulsion is the same). The thickness of the emulsion layer provides the following advantages, and the resulting image is superior to that obtained by ordinary phtography. A first advantage is that the thinner emulsion serves to reduce light scattering by silver halide grains in the emulsion layer, thus improving the resolving power. A second advantage is that the thinness of the emulsion enables an image projected on an emulsion layer through a lens to be focused well, i.e., to obtain a resolving power of 500 to 1000 lines/mm in an optical system the focal depth is around $5\mu$, and hence the thickness of the emulsion layer is desirably much less than this. However, an ordinary silver halide photographic emulsion layer has a thickness of $5\mu$ or more. A third advantage is that the thinness of the emulsion lowers reductions in resolving power due to halation. A fourth advantage is that in conducting etch-bleaching or a like chemical processing or baking, the thinness of the emulsion serves to improve the resolving power. A fifth advantage is that less silver is used. While the above advantages in accordance with the present invention are obtained using a thin emulsion, it should be understood by one skilled in the art that silver halide emulsion layers having a thickness similar to those used in conventional silver halide photographic elements can, of course, be used to provide excellent results. It is not convenient to use a hydrophilic metal layer and a silver halide layer (the ranges apply to each individual layer) of from about 0.5 to about $20\mu$ in thickness, more preferably from about 1 to about $10\mu$ thickness.

The term "baking" as is used herein designates heating at least the emulsion layer (also the subbing layer when used) at high temperature in an oxygen containing gas. Any gas containing about 5 to about 40% by volume of oxygen can be used. Preferred gases other than oxygen are chemically inert gases such as air, rare gases (helium, neon, argon, krypton, xenon, and radon), nitrogen gas, carbon dioxide gas, etc. The most convenient oxygen containing gas is air. Oxygen is necessary to gasify the thermally decomposed organic materials including the binder present on the hydrophilic metal layer. That is, since the binder and other oganic components present are organic materials and comprise carbon, hydrogen, oxygen, nitrogen, sulfur, etc., the gasification thereof after thermal decomposition requires oxygen to form gaseous oxides such as $CO_2$, $NO_2$, $H_2O$, $SO_2$ and the like. When baking is conducted in a vacuum or an inert gas, the binder and other organic materials are not removed even though they are decomposed. However, decomposition and gasification can proceed in the presence of oxygen.

The present invention is based, in part, however, on the discovery that decomposition and gasification of binder and other inorganic materials proceed at much more rapid rate in silver image areas then in non-silver image areas. Thus, baking in oxygen can be utilized to selectively remove silver image areas while permitting non-silver image areas to remain.

The pressure of the oxygen containing gas during baking is not important, and pressures around atmospheric pressure are conveniently used. However, a broad range of pressure including sub- and super-atmospheric pressures can be employed, if desired, i.e., the pressure of the oxygen containing gas during baking is not limited to particular range. Conveniently, baking is at atmospheric pressure.

A suitable baking temperature is not less than about 150° C., more preferably not less than about 250° C. The upper limit depends on the softening point of the support and the hydrophilic metal layer formed thereon. The upper limit is about 600° C. or the softening point of the support or the hydrophilic metal layer is the softening point is lower than about 600° C. If the baking temperature is low, the baking takes a long time. In the above-described temperature range, the binder of the emulsion layer is thermally decomposed and becomes a water-impermeable resist, and the support and/or the metal layer formed thereon is not softened or deformed. The decomposition point differs depending upon the kind of binder used and other organic components present. For example, alkali treated gelatin begins to decompose at a temperature of about 150° to 200° C., and turns yellow or brown. By baking at a higher temperature the binder turns dark red.

Various embodiments are included in the method for producing the multi-layer printing plate material of the present invention. In the following, representative embodiments are described in detail with reference to drawings. However, the method of the present invention is not limited to the following six embodiments.

FIG. 1 illustrates a first embodiment. In FIG. 1, "A" illustrates a side sectional view of a light-sensitive printing plate material 14 showing its layer construction in which numeral 10 designates a support metal layer having an oleophilic surface, 11 designates a hydrophilic metal layer formed thereon and 12 designates a non-hardened gelatin silver halide emulsion layer formed on the hydrophilic metal layer. "B" through "F" illustrate side sectional views of the printing plate material at major steps of the process for producing a printing plate in accordance with a first embodiment of the present invention using the light-sensitive printing plate material of "A".

"B" illustrates an exposure step in which the light-sensitive printing plate material 14 is exposed to light through an original 13, and a latent image 12a corresponding to the orginal image is formed in the emulsion layer 12 of the light-sensitive printing plate material.

"C" illustrates the printing plate material after developing with a tanning developer, where a silver image 12b is formed at the exposed area 12a of the emulsion layer 12. The emulsion layer at the exposed area is hardened to various degrees depending on the amount of exposure and the emulsion layer at the non-exposed area 12c is not hardened. As is well knwon in the art, a tanning developer hardens the gelatin layer at developed silver image areas through development of silver halide, and the emulsion layer is hardened depending on the amount of exposure.

"D" illustrates the printing plate material after the unhardened emulsion layer 12c at the non-silver image area is removed by immersion in hot water at a temperature ranging from about 30° to about 60° C., more preferably from about 35° to 50° C., typically for about 20 seconds to about 5 minutes, through this range is merely illustrative to obtain a relief image which is in a negative relation with the original image.

Thus obtained relief image is then baking-processed, for example, at about 300° C. for about 15 minutes in air, to thermally decompose the binder.

Baking is necessary to prevent the binder layer from being penetrated, swollen or dissolved by an etching solution which is used in the subsequent etching process for the hydrophilic metal layer. It has been found that when the gelatin binder layer is baking-processed it becomes etching solution-impermeable. Non-baked binder layer is penetrated by etching solution and cannot serve as a resist; accordingly, baking is essential in the present invention. The hydrophilic metal layer shows no chemical change during baking.

Etching is then carried out to remove the uncovered hydrophilic metal layer. Etching is effected using a method as is conventionally employed for the hydrophilic metal. Suitable etching solutions are aqueous solutions of hydrochloric acid, nitric acid, sulfuric acid, phosphoric acid, ferric chloride, aluminum chloride, zinc chloride, perchlorates (e.g., sodium perchlorate, potassium perchlorate, etc.), cerium (IV) salts (e.g., cerium (IV) nitrate, cerium (IV) sulfate, ammonium cerium (IV) sulfate, etc.), and mixtures thereof, etc. A suitable concentration of the etching solution ranges from about 5 to about 70wt%. Typically, etching is conducted at a temperature of from about 15° to about 40° C. and is conveniently completed in about 20 seconds to about 10 minutes. One skilled in the art will appreciate, of course, that the above ranges are subject to substantial variation and are not limtative. The concentration of the etching solution can be easily selected depending on the compound contained therein. By the etching process the uncovered hydrophilic metal layer at a non-silver image area is removed to uncover the oleophilic surface of the support metal therunder. This step is illustrated in "E".

Finally, the emulsion layer remaining at the silver image area is removed by swelling or dissolving to uncover the hydrophilic metal layer thereunder and to form the non-image area of the printing plate. This step is illustrated in "F". The removal of binder can be effected using an alkali (e.g., an aqueous solution of sodium hydroxide or potassium hydroxide at a concentration of about 10 to 20% by weight at about 40° to 60° C. for about 2 to 10 minutes, etc.), an acid (e.g., an aqueous solution of sulfuric acid at a concentration of about 30 to 70% by weight at about 60° to 98° C. for about 5 to 10 minutes, an aqueous solution of nitric acid at a concentration of about 30 to 70% by weight at about 60° to 95° C. for about 5 to 10 minutes, an aqueous solution of hydrochloric acid at a concentration of about 15 to 30% by weight at about 40° to 95° C. for about 2 to 10 minutes, etc.) or a salt (e.g., an aqueous solution of sodium hypochlorite or potassium hyprochlorite at a concentration of about 4 to 12% by weight at about 30° to 60° C. for about 1 to 5 minutes, etc.). The amount convenient method is to immerse the printing plate material in these aqueous solutions.

Thus, a printing plate having an image of a positive relationship with the original image is obtained.

Chemical etching of the hydrophilic metal layer was earlier discussed. It is, of course, not necessary to use chemical etching as the only etching procedure. On the contrary, if desired ion-etching can be used for the uncovered hydrophilic metal layer as an alternative to chemical etching, as can electrolytic etching. Ion-etching is particularly effective if the thickness of the hydrophilic metal layer is low (about 0.1 to about 1μ). By ion-etching, the hydrophilic metal layer at 12c as shown in C of FIG. 1 is gradually removed and at the same time the resist is gradually removed. The hydrophilic metal layer is successfully removed by ion-etching if the resist still remains or just disappears when the hydrophilic metal layer is just removed by ion-etching. The resist remaining after ion-etching can be removed in the same manner as described above, or ion-etching can be continued until no resist remains. The term "ion-etching" as used in the present invention designates the procedure of bombarding ions having a high energy against a substance so that the substance bombarded is removed. (see R. G. Wilson % G. R. Brewer, *ION BEAMS With Application to Ion Implantation*, pp. 317–335, John Wiley % Sons (1973) and L. I. Maissel & R. Glang, *Handbook of Thin Film Technology*, pp. 7–49–5–53, McGraw-Hill (1971). One example of ion-etching is cathode sputtering.

It should thus be clear from the principle of the present invention that the ion-bombarding technique used in the present invention is not limited only to cathode sputtering, on the contrary, any ion-bombarding technique developed which result in removal of the substance bombarded can be employed, for example, glow discharge and RF sputtering can be employed with success. Variations thereof will be apparent to one skilled in the art.

FIG. 2 illustrates a second embodiment of this invention. In FIG. 2, "A" illustrates a side sectional view of a light-sensitive printing plate material 24 showing its layer construction, wherein numeral 20 designates a support metal having an oleophilic surface, 21 designates a hydrophilic metal layer formed thereon and 22 designates an unhardened gelatin silver halide emulsion layer formed on the hydrophilic metal layer (if desired, a hardened gelatin silver halide emulsion layer can also be used). "B" through "E" illustrate side sectional views of the printing plate material at major steps of the process for producing a printing plate in accordance with the second embodiment of the present invention using the light-sensitive printing plate material of "A".

"B" illustrates an exposure step in which the light-sensitive printing plate material 24 is exposed to light through an original 23 and a latent image 22a corresponding to the original image is formed in the emulsion layer 22 of the light-sensitive printing plate material.

"C" illustrates the printing plate material after development with a high contrast developer (e.g., a lith type developer), and a silver image 22b is formed at the exposed area 22a of the emulsion layer 22. The thus formed silver image, is a negative image relative to the original image. After developing, the printing plate material can be subjected to a fixing process, however, fixing is usually omitted. The emulsion layer at the non-exposed area 22c contains no silver halide when fixing is conducted and contains silver halide when fixing is not conducted. After rinsing with water the printing plate material is processed with a known etch-bleaching solution to remove the emulsion layer at the silver image area. The emulsion layer is then rubbed with a sponge or a soft brush in water at a temperature ranging from 0° to about 40° C., preferably about 12° to 30° C., to completely remove the emulsion layer at the silver image area 22b and uncover the hydrophilic metal layer 21. The emulsion layer at the non-silver image area remains and forms a gelatin relief image 22c. This step is illustrated in "D".

The baking process and the subsequent processes as described in the first embodiment are then followed to obtain a printing plate (E).

Etch-bleaching solutions which can be used in the present invention must contain at least one oxidizing agent such as hydrogen peroxide, peroxodisulfates (e.g., sodium peroxodisulfate, potassium peroxodisulfate, ammonium peroxodisulfate, etc.), etc., and can contain a compound which promotes the action of an oxidizing agent, such as a copper (II) salt (e.g., copper (II) chloride, copper (II) bromide, copper (II) nitrate, copper (II) sulfate, copper (II) nitrate, and other water-soluble copper (II) salts), an iron (III) salt(e.g., a water-soluble iron (III) salt such as iron (III) chloride, iron (III) sulfate, iron (III) nitrate, etc.) and an acid (e.g., an organic acid such as acetic acid, tartaric acid, citric acid, lactic acid, etc., and inorganic acids such as sulfuric acid, hydrochloric acid, nitric acid, phosphoric acid, etc.), etc. The oxidizing agent is conveniently used in an amount of from about 0.01 to about 10% by weight of the etch-bleaching solution, more preferably from 0.1 to 5% by weight. As one skilled in the art appreciate, at substantially lower amounts the etch-bleaching effect is reduced, and no substantial benefits are obtained by using substantially greater amounts. The etch-bleaching solution can further contain a compound which forms a salt or complex of low solubility when reacted with silver. Examples of such compounds are halides (e.g., potassium bromide, potassium chloride, sodium bromide, sodium chloride, etc.), tartarates (e.g., sodium tartarate, potassium tartarate, etc.), carbonates (e.g., sodium carbonate, potassium carbonate, etc.), citrates (e.g., sodium citrate, potassium citrate, etc.), etc. Of these, halides are particularly effective. These compounds can be contained in the etch-bleaching solution separately or as a combination of two or more thereof.

A suitable amount of these compounds can range from about 0.05 to about 50% by weight of the etch-bleaching solution. The solubility of some of these compounds is less than about 50% by weight; however these compounds can be used if the solubility thereof is more than about 0.05% by weight.

Examples of etch-bleaching solutions as can be used in embodiment 2 and in embodiment 6 are an aqueous solution containing copper (II) chloride, citric acid and hydrogen peroxide, an aqueous solution containing copper (II) nitrate, potassium bromide, lactic acid and hydrogen peroxide, an aqueous solution containing iron (III) nitrate, potassium bromide, lactic acid and hydrogen peroxide, and aqueous solutions identical to the above-described aqueous solutions except for substituting a peroxodisulfate (e.g., sodium peroxodisulfate, potassium peroxodisulfate, ammonium peroxodisulfate, etc.) for hydrogen peroxide.

FIG. 3 illustrates a third embodiment of this invention. In FIG. 3, "A" illustrates a side sectional view of a light-sensitive printing plate material 34 showing its layer construction in which numeral 30 designates a support metal layer having an oleophilic surface, 31 designates a hydrophilic metal layer formed thereon and 32 designates an unhardened gelatin silver halide emulsion layer formed on the hydrophilic metal layer. "B" through "E" illustrate side sectional views of the printing plate material at major steps of the process for producing a printing plate in accordance with a third embodiment of the present invention using the light-sensitive printing plate material of "A".

"B" illustrates an exposure step in which the light-sensitive printing plate material 34 is exposed to light through an original 33 and a latent image 32a corresponding to the original image is formed in the emulsion layer 32 of the light-sensitive printing plate material.

"C" illustrates the printing plate material after development with a high contrast developer (e.g., a lith type developer), and a silver image 32b is formed at the exposed area 32a of the emulsion layer 32. The thus formed silver image is a negative image of the original image. After developing, the printing plate material can be subjected to a fixing process, however, fixing is usually omitted. After rinsing with water the printing plate material is processed with a tanning-bleach solution to bleach the silver image and at the same time to harden the gelatin at the silver image area. The emulsion layer at non-silver image areas is not hardened (32c). The emulsion layer is then immersed in water at a temperature ranging from about 30° to about 60° C., preferably from about 35 to about 50° C., conveniently for about 30 seconds to about 5 minutes, though this range is not limitative, to remove the emulsion layer at the non-image area 32c and to form a gelatin relief image 32b. This step is illustrated in "D".

After drying, the baking process and the subsequent processes as described in the first embodiment are followed to obtain a printing plate (E).

By tanning bleaching, the silver image is converted to a silver halide image, or the silver image is dissolved into the tanning bleaching solution. When silver halide is formed by tanning bleaching, the silver halide may be dissolved away before being subjected to the subsequent processing.

The tanning bleaching solution which can be used for the third embodiment must contain a chromium compound which contains hexavalent chromium ions such as a dichromate (e.g., sodium dichromate, potassium dichromate, ammonium dichromate, etc.), a chromate (e.g., sodium chromate, potassium chromate, ammonium chromate, chromic acid, etc.), etc. Good results are obtained when the chromium compound is present in an amount of from about 0.1 molar to the saturation level thereof at the processing temperature. The bleaching solution can contain other oxidizing agents such as hydrogen peroxodisulfate (e.g., sodium peroxosulfate, potassium peroxodisulfate, ammonium peroxodisulfate, etc.), a hexacyanoferrate (III) (e.g., sodium ferricyanide, potassium ferricyanide, etc.), etc. The bleaching solution can further contain a copper (II) salt, an acid and a compound which forms a salt or complex of low solubility when reacted with silver, to promote the hardening action of the gelatin by the hexavalent chromium ions. Examples of copper (II) salts are copper (II) chloride, copper (II) bromide, copper (II) nitrate, copper (II) citrate, etc. Of these, copper (II) halides are particularly desired. Examples of acids are organic acids such as acetic acid, citric acid, tartaric acid, etc., and inorganic acids such as hydrochloric acid, nitric acid, sulfuric acid, phosphoric acid, etc. Examples of the compound which can form a salt or complex of low solubility when reacted with silver are the same compounds as earlier described as exhibiting such a function for etch-bleaching solutions, that is, halides, tartarates, carbonates, citrates, etc. Of these, halides are most effective. These promoting agents can be used separately or as a combination of two or more thereof.

A suitable amount of the promoting agents ranges from about 0.05 to about 50% by weight of the bleaching solution. Some of these compounds have a solubility less than about 50% by weight; however these compounds can be used if the solubility thereof is more than about 0.05% by weight.

FIG. 4 illustrates a fourth embodiment of the invention, where baking is conducted to obtain a resist image. In FIG. 4, "A" illustraes a side sectional view of a light-sensitive printing plate material 44 showing its layer construction in which numeral 40 designates a support metal layer having an oleophilic surface, 41 designates a hydrophilic metal layer formed thereon and 42 designates a hardened or unhardened gelatin silver halide emulsion layer formed on the hydrophilic metal layer. "B" through "F" illustrate side sectional views of the printing plate material at major steps of the process for producing a printing plate in accordance with the fourth embodiment of the present invention using the light-sensitive printing plate material of "A".

"B" illustrates an exposure step in which the light-sensitive printing plate material 44 is exposed to light through an original 43, and a latent image 42a corresponding to the original image is formed in the emulsion layer 42 of the light-sensitive printing plate material.

"C" illustrates the printing plate material after development with a high contrast developer (e.g., a lith type developer), and a silver image 42b is formed at the exposed area 42a of the emulsion layer 42. The thus formed silver image is a negative of the original silver image. After developing, the printing plate material can be subjected to a fixing process, however, fixing is usually omitted. After rinsing with water, the printing plate material is treated with a tanning bleach solution. Treatment is conveniently conducted at about 10° to about 40° C., with good tanning bleaching being obtained in about 15 seconds to about 10 minutes, though one skilled in the art will appreciate these ranges are not limitative. The emulsion layer at the non-silver image area 42c is not hardened, whereas the emulsion layer at the silver image is hardened and at the same time the silver image is bleached to form silver halide or to dissolve the silver into the tanning bleach solution as silver ions. When halogen ions are present in the tanning bleach solution, silver halide is formed. When the tanning bleach solution comprises a dichromate and sulfuric acid, silver halide is not formed. The printing plate material is then treated with a fixing solution as earlier exemplified to remove the silver halide at the non-silver image area and formed at the silver image area. It should be noted that when any compound soluble in a fixing solution is formed, fixing can be utilized. For example, an aqueous solution of a dichromate and nitric acid can be used as a bleaching solution, silver dichromate being formed which is soluble in a fixing solution. After rinsing with water and drying, the printing plate material is baking-processed. By baking, the binder at the silver image area is thermally decomposed and removed to uncover the hydrophilic metal layer thereunder as shown in "D". The binder at the non-image area is thermally decomposed and colored but is not removed (42d). The uncovered hydrophilic metal layer is then etched away to uncover the olephilic surface thereunder as shown in "E". The decomposed binder layer at the non-image area and the hydrophilic metal layer thereunder remain intact. Finally the decomposed binder layer remaining at the non-image area is removed to obtain a printing plate ("F"), for example, by immersion in an aqueous solution of sodium hypochlorite (about 1 to 10% by weight, about 40° to 50° C., for about 2 to 10 minutes).

The tanning bleach solution which can be used for this embodiment is the same as that described in the third embodiment.

Baking is conducted in an oxygen containing gas to preferentially remove the emulsion layer at the tanning bleach processed silver image area and to render the emulsion layer at the non-silver image area etching solution-impermeable, etching solution-insoluble or resistant to swelling. It has been found that by baking after tanning bleaching the emulsion layer at the silver image area is rapidly removed, whereas the emulsion layer at the non-silver image area is just thermally decomposed and turns a dark brown and becomes etching solution-impermeable. Non-baking processed emulsion layer is etching solution permeable and cannot act as a resist, therefore, it can be understood that baking is essential in the present invention. During baking the hydrophilic metal layer undergoes no chemical change.

Etching of the hydrophilic metal layer and subsequent processing can be conducted in the same manner as described for the first embodiment of this invention.

When tanning bleaching is conducted after developing and fixing in the fourth embodiment using a bleaching solution (e.g., an aqueous solution of potassium dichromate and sulfuric acid) free of halide, no silver halide is formed at the silver image area. In this case, removal of silver halide is not necessary, and, accordingly, baking can be conducted directly after bleaching. Also, when tanning bleaching is conducted after developing and without fixing using the above-described tanning bleaching solution in the fourth embodiment, the silver at the image area is dissolved away, whereas the silver halide at the non-image area remains intact. In this case, by baking, the binder at the silver image area is rapidly removed and the emulsion layer at the non-silver image area is thermally decomposed and contains silver halide.

In the fourth embodiment the use of a bleaching solution containing hexavalent chromium ions is essential. A bleaching solution other than one containing hexavalent chromium ions cannot provide the above-described effect of the present embodiment. For example, a bleaching solution comprising a ferricyanide and potassium bromide cannot be used for the present embodiment. Also, a bleaching solution comprising ferric chloride cannot be used for the present embodiment.

FIG. 5 illustrates a fifth embodiment of the present invention where baking is conducted to preferentially remove binder at silver image areas. In FIG. 5, "A" illustrates a side sectional view of a light-sensitive printing plate material 54 showing its layer construction in which numeral 50 designates a support metal layer having an oleophilic surface, 51 designates a hydrophilic metal layer formed thereon and 52 designates a hardened or unhardened gelatin silver halide emulsion layer formed on the hydrophilic metal layer. "B" through "F" illustrate side sectional views of the printing plate material at various steps of the process for producing a printing plate in accordance with the present embodiment using the light-sensitive printing plate material of "A".

"B" illustrates an exposure step in which the light-sensitive printing plate material 54 is exposed to light through an original 53, and a latent image 52a corresponding to the original image is formed in the emulsion layer 52 of the light-sensitive printing plate material.

"C" illustrates the printing plate material after development with a high contrast developer (e.g., a lith type developer), and a silver image 52b is formed at the exposed area 52a of the emulsion layer 52. Silver halide remains in the emulsion layer at the non-exposed area 52c. The thus formed silver image is a negative of the original image. After fixing, rinsing with water and drying, the printing plate material is subjected to baking.

Baking is conducted, for example, at 450° C. for about 5 minutes, and at 500° C. for about 2 to 3 minutes. The baking temperature in this fifth embodiment is selected to be greater than that in the fourth embodiment. By baking, only the binder at the silver image area is removed and a binderless silver image 52d remains as shown in "D". The binder at the non-image area 52c is decomposed and colored but is not removed and forms a water-impermeable resist image 52e. The hydrophilic metal layer at the silver image area is then etched away, for example, by the method as described in the first embodiment, and at the same time the silver image is removed to uncover the surface of the oleophilic metal layer as shown in "E". Finally the binder remaining at the non-image area is removed, for example, by the method as described in the fourth embodiment, to obtain a printing plate as shown in "F".

By baking, the binder of the emulsion layer at the silver image area is thermally decomposed and gasified. The baking time mainly depends on the baking temperature and the thickness of the binder layer. The higher the baking temperature and the smaller the thickness of the binder layer is, the lower the baking time.

It has been found that in about 2 to about 30 minutes of baking the binder at the silver image area is completely or almost completely gasified, while the decomposed binder at the non-image area still remains. That is, the binder at the silver image area is gasified faster than the binder at the non-image area. For example, when the binder layer mainly comprises alkalitreated gelatin having a thickness of about $2\mu$ and baking is conducted in air at about 450° C., it takes about 15 minutes for the binder at the non-image area to be completely gasified, whereas the binder at the silver image area only takes about 5 minutes to be completely gasified. Accordingly, if baking is discontinued after 5 minutes, a sufficient amount of decomposed binder remains at the non-silver image area but no decomposed binder remains at the silver image area, and the thus formed binderless silver image can be easily dissolved away with a solvent for silver. A "sufficient amount" of decomposed binder remains when the amount is sufficient to be impermeable to etching solution. If the amount is not sufficient, etching solution reaches the hydrophilic metal layer through the decomposed binder layer. While this definition of a "sufficient amount" is correlated with the function or effect of the decomposed binder, such can easily be determined by one skilled in the art, since if etching has or has not proceeeded in any area of the hydrophilic metal layer is easily determined by conventional analysis techniques.

The apperence of the binderless silver image is non-glossy and grey, and the transmission optical density of the binderless silver image is much smaller than that of an unbaked silver image. It is believed that the transmission optical density of the binderless silver image is low and the appearance of the binderless silver image is non-glossy and grey because silver atoms migrate to form large silver grains, and, accordingly, spacings exist therebetween. By baking, the silver image is degraded as described above; however, the binder layer at the non-silver image area has a sufficiently large transmission optical density, is non-granular and has smooth edges and a high contrast. It should be noted in this regard that the optical density of the decomposed binder layer and non-silver image area is proportional to the thickness of the layer which, in turn, is related to the resistance thereof to etching solutions. Optical density is, therefor, an indication of resistance to etching solutions. Further, the decomposed binder layer is impermeable to various aqueous solutions, and acts as a resist for aqueous etching solutions.

Solvents for silver are aqueous solutions containing known oxidizing agents such as those described in the second embodiment as oxidizing agents which can be contained in the etch-bleaching solution, compounds to promote the action of the oxidizing agent, and further hexacyanoferrates (III) (e.g., the sodium salt, the potassium salt, etc.), dichromates (e.g., the sodium salt, the potassium salt, the ammonium salt, etc.), permanganates (e.g., the sodium salt, the potassium salt, etc.), or a mixture thereof. The solvent can contain a compound which forms a salt or complex of low solubility as described in the second embodiment. The concentration of these compounds can be the same as in the etch-bleaching solution as described in the second embodiment.

When the etching solution for the hydrophilic metal layer is a solvent for silver, dissolution of silver and etching of the hydrophilic metal layer proceed at the same time. Further, as is already described, since the binderless silver image is porous, the silver image is not necessarily removed as the etching solution for the hydrophilic metal layer can reach the hydrophilic metal layer through pores in the silver image. Upon etching of the hydrophilic metal layer, the silver image easily comes off. After etching the hydrophilic metal layer, removal of the decomposed binder remaining at the non-silver image area can be conducted in the same manner as described in the first embodiment.

Figure 6:
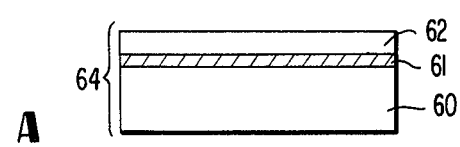
Figure 6:
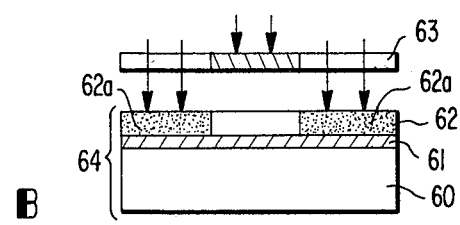
Figure 6:
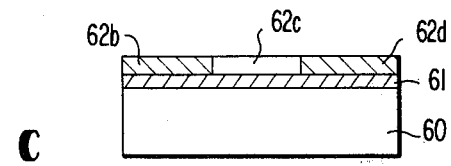
Figure 6:
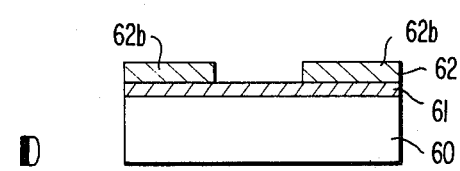
Figure 6:
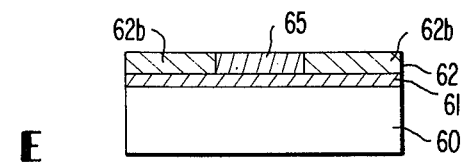
Figure 6:
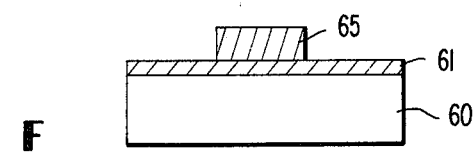

FIG. 6 illustrates a sixth embodiment of the present invention. In FIG. 6, "A" illustrates a side sectional view of a light-sensitive printing plate material 64 showing its layer construction, in which numeral 60 designates a support metal layer having an oleophilic surface, 71 designates a hydrophilic metal layer formed thereon and 62 designates a hardened or unhardened gelatin silver halide emulsion layer formed on the hydrophilic metal layer. "B" through "F" illustrate side sectional views of the printing plate material at major steps of the process for producing a printing plate in accordance with the present embodiment using the light-sensitive printing plate material of "A".

"B" illustrates an exposure step in which the light-sensitive printing plate material 64 is exposed to light through an original 63, and a latent image 62a corresponding to the original image is formed in the emulsion layer 62 of the light-sensitive printing plate material.

"C" illustrates the printing plate material after development with a developer, and a silver image 62b is formed in the emulsion layer 62 at the exposed area 62a. The emulsion layer at the non-exposed area is shown as 62c. A relief image which comprises the silver image area or the non-silver image area is then formed using any method of the above-described embodiments. The thus obtained relief image is then subjected to baking. Developing, relief image forming and baking can be conducted using any of the procedures described in the preceeding embodiments. "D" illustrates the printing plate material with a relief image formed by the method of the first embodiment.

By baking, the relief image is converted into a substantially water-insoluble resist image. On the areas of the hydrophilic metal layer not covered with resist, an oleophilic metal layer 65 is then provided using a conventional electroplating, electroless plating, vacuum deposition, sputtering, ion plating or the like. Of these, electroplating and electroless plating are particularly preferred. "E" illustrates the printing plate material after the oleophilic metal layer 65 is formed by electroplating or electroless plating. The resist image is then removed in the same manner as described in the first embodiment to uncover the hydrophilic metal layer thereunder and obtain a printing plate as shown in "F". The substantially water-impermeable resist image can also be obtained using any method described in the second through fifth embodiments.

Among methods for providing a layer of oleophilic metal on the hydrophilic metal layer, the most suitable are electro-or electroless plating, the latter of which will be described in detail in the following. Electrolytic plating techniques are so well known in the art, and this art is so highly developed at present, that no discussion is believed necessary for one skilled in the art to be enable to form an appropriate layer of electrolytic deposition.

The method for plating which can be used in the present embodiment includes any conventional plating method. The electroless plating solutions used generally comprise an oleophilic metal ion source, an alkali or acid, a chelating agent, and a reducing agent.

The oleophilic metal ion source is a metal compound which is easily ionized in aqueous solution and can provide oleophilicity to a plated metal, such as copper, silver, zinc, brass, etc. Of these, copper is the most preferred, and suitable copper compounds are copper (II) salts of inorganic acids (e.g., copper sulfate, copper (II) nitrate, copper (II) chloride, etc.). The amount of the metal ion source in the plating solution is not limited to any particular range, however, a range from about 0.002 to about 0.06 mole/liter is preferred.

An alkali or acid is present to adjust the pH of the plating solution. Examples of alkalis are metal hydroxides such as sodium hydroxide, potassium hydroxide, lithium hydroxide, etc. Examples of acids are hydrochloric acid, sulfuric acid, oxalic acid, phosphoric acid, etc. A suitable pH value for an electroless plating solution ranges from about 10 to about 14. The pH value for an electroplating solution is not limited to any particular range. A suitable pH value for an acid copper plating solution ranges from about 0.5 to about 2.0, and for an alkali copper plating solution, such as copper cyanide plating solution, from about 12 to about 14.

The chelating agent is present to prevent metal ion, e.g., copper, from precipitating in either an acid or alkali plating solution. Suitable chelating agents are Rochelle salt, ethylenediaminetetraacetic acid, citric acid, triethanolamine, etc. A suitable amount of the chelating agent present ranges from about 0.5 to about 5 moles of the copper compound.

Examples of the reducing agent are formalin, paraformaldehyde, glyoxal, etc. Of these, formalin is the most preferred. Good results are obtained when the reducing agent is used in an amount of 0.1 to 10% by weight of the plating solution, more preferably from 0.5 to 5% by weight of the plating solution.

If desired, the plating solution can contain a preservative such as a carbonate (e.g., sodium carbonate, potassium carbonate, etc.), a plating promoting agent such as an acetate, triethanolamine, ethylenediaminetetraacetic acid, etc., an antioxidant to prevent plated metal from oxidizing such as a sulfate, etc.

A suitable temperature for the plating solution depends on the composition of the solution, etc., and such cannot be set forth unequivocally. However, in general, a temperature range providing a plating rate of about $1\mu/60$ min. to about $10\mu/60$ min. is generally employed.

The composition of the plating solutions and the plating conditions will be clear to one skilled in the art, and will be selected depending on the desired objects. A suitable thickness of plated copper ranges from about 0.1 to about $20\mu$, more preferably about 0.2 to about $10\mu$.

Needless to say, the hydrophilic metal "layer" can itself be the support or any metal, ceramic or high melting point polymer having thereon a hydrophilic metal layer can act as a support in the present invention.

In embodiments 1–3 described above, it is most preferred that the baking time be about 1 to about 90 minutes, and such will be selected depending upon the baking temperature, i.e., at higher baking temperatures lower times are used and at lower baking temperatures higher times are used. In embodiments 4 and 5, the baking time is most preferably about 2 to about 30 minutes, with a similar dependency on baking temperature to that earlier discussed.

As can be seen from the descriptions on the above-described representative embodiments, in the present invention a printing plate having a positive image can be obtained from either a positive or negative by properly selecting a process from the above embodiments.

The method of the present invention utilizes a silver halide emulsion as a light-sensitive material, and, accordingly, the following advantages are obtained. The method of manufacture of silver halide emulsions is well established and stable, and production in either large or small amount is possible. Further, the shelf-life of a light-sensitive printing plate material formed therefrom is long and the unexposed material can be stored for a long period of time (e.g., more than one year). Also, the light-sensitive printing plate material has high sensitivity, and, accordingly, exposing is simple. In addition, the printing plate manufacturing process is the same as conventional processes for silver halide photography or slightly modified, and, accordingly, processing is easy. Further, enviromental pollution is avoided. The above-described advantages are particularly effective from the economic and processing viewpoints.

In any of the heretofore described embodiments where a lith developer is used, conventional lith developers are acceptable, e.g., as disclosed in U.S. Pat. Nos. 2,388,816 and 3,158,483, etc.

The following examples are given to illustrate the present invention in greater detail. Unless otherwise indicated, all parts, percents, ratios and the like are by weight.

EXAMPLE 1 (first embodiment)

On an iron plate (thickness of 0.2 mm) copper was electroplated to a thickness of 7μ, and then chromium was electroplated on the copper layer to a thickness of 1μ to provide a support. A panchromatically sensitized lith type silver chlorobromide emulsion (70 mole% silver chloride; mean grain size: 0.3μ; 1 mole of silver per 1 Kg of emulsion) containing no hardening agent was coated to provide a dry thickness of 3μ on the chromium layer of the support, and then dried to obtain a light-sensitive printing plate material. The light-sensitive printing plate material was exposed to light through an original using a Fuji Exposure Lamp (made by Fuji Photo Film Co., Ltd.) at an input voltage of 14 V and a distance of 1 m between the light source and the light-sensitive printing plate material for 0.5 sec and then development-processed in a developer having the following composition (20° C., 2 min.) to obtain a silver image.

| Developer | |
|---|---|
| Solution A | |
| Pyrogallol | 6 g |
| Citric Acid | 5 g |
| p-Methylaminophenol | 3 g |
| Water to make | 1 liter |
| Solution B | |
| Sodium Carbonate | 200 g |
| Potassium Bromide | 5 g |
| Calgon (Trade name, produced by Calgon Inc., polymetasodium phosphate; mainly hexametasodium phosphate) | 3 g |
| Water to make | 1 liter |

One part by volume of Solution A and one part by volume of Solution B are mixed just before use.

The thus obtained silver image was a negative of the original image and the binder at the silver image area was hardened. After developing, the printing plate material was immersed in a stop bath for tanning development having the following composition (20° C., 30 sec.).

| Stop Bath | |
|---|---|
| Sodium Sulfite (anhydrous) | 10 g |
| Sodium Hydrogen Sulfite | 25 g |
| Water to make | 1 liter |

The printing plate material was then immersed in water for 2 minutes at 50° C. to remove the unhardened gelatin silver halide emulsion layer at the non-silver image area and to uncover the chromium layer thereunder. Thus, a relief image which was a negative of the original image comprising hardened gelatin and silver was obtained. After rinsing with water at 20° C. for 30 sec., and drying at 40° C. for 10 minutes, the printing plate material was heated (hereinafter this process is designated "baking") to 300° C. in the air for 20 minutes, and then immersed in an etching solution having the following composition (21° C., 15 min.) to dissolve away the chromium layer at the non-silver image area and to uncover the copper layer thereunder to obtain an image area which was a positive of the original image. It is to be noted in this regard that after the printing plate material of the present invention is formed, generally the processing of the present invention is relatively rapid since, for instance, drying is only necessary prior to baking.

| Etching Solution | |
|---|---|
| Aluminum Chloride | 50 g |
| Zinc Chloride | 120 g |
| Phosphoric Acid (85%) | 10 ml |
| Water to make | 1 liter |

Finally, the printing plate material was immersed in an aqueous solution of sodium hydroxide at a concentration of 20% by weight at 40° C. for 3 minutes to remove the resist remaining at the non-image area and to uncover the chromium layer thereunder to obtain a printing plate.

The thus obtained printing plate was mounted on an offset printing machine (Davidson 500, manufactured by Davidson Co., Ltd.), and 2,000,000 good printed copies were obtained using a commercially available ink and dampening water. After the 2,000,000th impression, no damage was observed on the printing plate, and more impressions were possible.

EXAMPLE 2 (second embodiment)

On an aluminum plate (thickness of 0.2 mm) a copper layer was electroplated to a thickness of 7μ and nickel then electroplated on the copper layer to a thickness of 1μ to obtain a support. A panchromatically sensitized high contrast lith type silver chlorobromide emulsion (70 mole% silver chloride; mean grain size: 0.4μ; 1 mole of silver per 1 Kg of emulsion) containing a hardening agent (mucochromic acid, 120 ml of a 2% (weight) solution) was coated to provide a dry thickness of about 5μ on the nickel layer of the support, and then dried. A 1% aqueous solution of gelatin was then coated to provide a dry thickness of about 1μ on the emulsion layer, and then dried to obtain a light-sensitive printing plate material. The light-sensitive printing plate was exposed to light through a color negative original (having continuous gradation) and a contact screen for 2 seconds using a Fuji Exposure Lamp (made by Fuji Photo Film Co., Ltd.) at an input voltage of 18 V and at a distance between the light source and the light-sensitive printing plate material of 1 m.; further a red filter Fuji Filter SC 62 (made by Fuji Photo Film Co., Ltd.) was used between the light source and the photographic material. After exposure, the light-sensitive printing plate material was development-processed in a lith type developer having the following composition (20° C., 3 min.).

| Developer | |
|---|---|
| Sodium Sulfite (anhydrous) | 30 g |
| Boric Acid | 7 g |
| Hydroquinone | 20 g |
| Potassium Bromide | 25 g |
| Paraformaldehyde | 15 g |
| Sodium Hydrogen sulfite | 2 g |

| Developer | |
|---|---|
| Sodium Carbonate (monohydrate) | 85 g |
| Water to make | 1 liter |

After rinsing with water, the printing plate material was immersed in an etch-bleaching solution containing an equal volume of Solution I and Solution II having the following composition (25° C., 1 min.).

| Solution I | | |
|---|---|---|
| Copper (II) Chloride (dihydrate) | 10 g | |
| Citric Acid | 10 g | |
| Water to make | 1 liter | |
| Solution II | | |
| 3% Aqueous solution of hydrogen peroxide | | |

By this treatment the silver image was bleached, and by mild rubbing of the emulsion layer with a sponge in water at 40° C., the emulsion layer at the bleached area was removed to uncover the nickel layer thereunder. Thus, a relief image which was a positive of the original image was obtained.

The printing plate was then baking-processed as in Example 1, and then immersed in an etching solution having the following composition (22° C., 8 min.) to remove the nickel layer at the silver image area and uncover the copper layer thereunder.

Etching Solution 40 wt% Aqueous solution of ferric chloride

The resist remaining at the non-silver image area was removed in the same manner as described in Example 1 to uncover the nickel layer thereunder and obtain a printing plate.

Thus obtained printing plate was mounted on a printing machine and 200,000 printed copies were obtained. The thus obtained cyan separation image possessed high quality and good tone reproducibility. No damage was observed on the printing plate and more impressions were possible after 200,000 copies.

Using similar processing, a magenta, yellow and black image were superimposed on the cyan image to obtain a four color print.

EXAMPLE 3 (third embodiment)

The same light-sensitive printing plate material as described in Example 1 was exposed to light through an original in the same manner as described in Example 1 and development-processed in a developer having the following composition (25° C., 5 min.) to obtain a silver image which was a negative of the original image.

| Developer | | |
|---|---|---|
| Paraformaldehyde | 7.5 | g |
| Sodium Sulfite (anhydrous) | 30 | g |
| Sodium Hydrogen sulfite | 2.2 | g |
| Boric Acid | 7.5 | g |
| Hydroquinone | 22.5 | g |
| Potassium Bromide | 1.6 | g |
| Water to make | 1 | liter |

After rinsing with water, the printing plate material was immersed in a bleaching solution having the following composition (20° C., 3 min.) to bleach the silver image and at the same time harden the emulsion layer at the silver image area.

| Bleaching Solution | |
|---|---|
| Solution A | |
| Copper Sulfate | 80 g |
| Water to make | 500 ml |
| Solution B | |
| Potassium Bromide | 50 g |
| Potassium Dichromate | 4 g |
| Water to make | 500 ml |

One part by volume of Solution A and one part by volume of Solution B are mixed just before use.

The printing plate material was then immersed in water of 50° C. for 2 minutes to remove the unhardened emulsion layer at the non-silver image area and uncover the chromium layer thereunder. A relief image comprising a hardened silver image was thus obtained. After drying at 40° C. for 10 minutes, the printing plate material was subjected to the subsequent processes as described in Example 1 to obtain a printing plate of excellent quality.

EXAMPLE 4 (fourth embodiment)

The same light-sensitive printing plate material as described in Example 1 was exposed to light through an original as described in Example 1 and was then development-processed in a developer having the following composition (24° C., 5 min.) to obtain a silver image which was a negative of the original image.

| Developer | | |
|---|---|---|
| 1-Phenyl-3-pyrazolidone | 0.5 | g |
| Sodium Sulfite | 50 | g |
| Hydroquinone | 12 | g |
| Sodium Carbonate (monohydrate) | 60 | g |
| Potassium Bromide | 2 | g |
| Benzotriazole | 0.2 | g |
| Water to make | 1 | liter |

After rinsing with water, the printing plate material was immersed in a bleaching solution having the following composition (20° C., 2 min.).

| Bleaching Solution | |
|---|---|
| Potassium Dichromate | 15 g |
| Hydrochloric Acid (36.5%) | 8 ml |
| Water to make | 1 liter |

After rinsing with water, the printing plate material was immersed in a fixing solution having the following composition (24° C., 2 min.) to remove silver halide at the image and non-image areas.

| Fixing Solution | | |
|---|---|---|
| 70% Aqueous Solution of Ammonium Thiosulfate | 200 | ml |
| Sodium Sulfite | 15 | g |
| Boric Acid | 8 | g |
| Glacial Acetic Acid | 16 | ml |
| Aluminum Sulfate | 10 | g |
| Sulfuric Acid (98%) | 2 | ml |
| Water to make | 1 | liter |

After rinsing with water and drying at 40° C. for 10 minutes, the printing plate material was baking-processed in air at about 400° C. for about 8 minutes to selectively remove the binder at the non-silver image area. The printing plate material was then immersed in the etching solution (21° C., 12 min.) as described in Example 2 to remove the chromium layer at the exposed area. The same subsequent procedures as described in Example 1 were followed and the same results as described in Example 1 were obtained.

EXAMPLE 5 (fifth embodiment)

1,400 ml of a silver iodobromide emulsion (content of silver iodide: 1 mole%; mean grain size of silver bromide: about $0.06\mu$) was prepared using 50 g of gelatin, 186 g of silver bromide and 2 g of silver iodide. To this emulsion there was added 0.25 g of 4-methyl-2,3-diethoxathiazolocarbocyanine iodide (to optically sensitize the emulsion to light of a wavelength of 510 m$\mu$ to 530 m$\mu$) and a hardening agent (mucochloric acid, 2% (wt.) 75 ml; plus mucobromic acid, 3% (wt) 75 ml). The emulsion was then coated to provide dry thickness of about $2\mu$ on the same support as was described in Example 1, and then dried to obtain a light-sensitive printing plate material. This light-sensitive printing plate material was exposed to light through an original as described in Example 1 except for using an input voltage of 18 V for 5 seconds. The light-sensitive printing plate material was then development-processed in a developer having the following composition (24° C., 5 min.), followed by fixing in a fixing solution having the following composition (24° C., 1 min.) to obtain a silver image which was a negative of the original image.

| Developer | | |
|---|---|---|
| 1-Phenyl-3-pyrazolidone | 0.5 | g |
| Sodium Sulfite (anhydrous) | 50 | g |
| Hydroquinone | 12 | g |
| Sodium Carbonate (monohydrate) | 60 | g |
| Potassium Bromide | 2 | g |
| Benzotriazole | 0.2 | g |
| 1-Phenyl-5-mercaptotetrazole | 5 | mg |
| Phenazine-2-carboxylic Acid | 1 | g |
| Water to make | 1 | liter |
| Fixing Solution | | |
| 70% Ammonium Thiosulfate Aqueous solution | 200 | ml |
| Sodium Sulfite (anhydrous) | 15 | g |
| Boric Acid | 8 | g |
| Glacial Acetic Acid | 16 | ml |
| Potassium Alum | 20 | g |
| Sulfuric Acid (98%) | 2 | ml |
| Water to make | 1 | liter |

After rinsing with water, the printing plate material was immersed in a bleaching solution having the following composition (20° C., 3 min).

| Bleaching Solution | |
|---|---|
| Potassium Dichromate | 15 g |
| Hydrochloric Acid (36.5%) | 8 ml |
| Water to make | 1 liter |

After rinsing with water and drying at 40° C. for 10 minutes, the printing plate material was baking-processed in the air at 500° C. for 3 minutes to selectively remove the binder at the silver image area. The printing plate material was then immersed in the etching solution (21° C., 15 min.) as described in Example 2 to remove the silver image and the chromium layer thereunder.

The same subsequent procedures as described in Example 1 were followed and the same results as described in Example 1 were obtained.

EXAMPLE 6

The same procedures as described in Example 1 were followed except that a stainless steel (SUS 304, 18% chromium, 8% nickel and 74% iron) layer having a thickness of $1\mu$ was used instead of the chromium layer and a subbing layer having the following composition was coated in a dry thickness of about $1\mu$ on the stainless steel layer using an immersion method. In addition, etching of the stainless steel layer was conducted using an etching solution having the following composition (22° C., 10 min.).

Subbing Solution

A solution prepared by adding 4.5 g of nitrocellulose (nitrocellulose RS ⅛; made by Daisel Ltd.) and 100 g of acetone while stirring to a gelatin dispersion comprising:

| | | |
|---|---|---|
| Gelatin | 4 | g |
| Salicylic Acid | 1.2 | g |
| Methanol | 1.8 | g |
| Ethylene Chloride | 550 | g |
| Acetone | 150 | g |
| Etching Solution | | |
| Ferric Chloride (37% aqueous solution) | 100 | ml |
| Hydrochloric Acid (36.5%) | 5 | ml |

Almost the same results as in Example 1 were obtained.

EXAMPLE 7 (sixth embodiment)

A lith type silver chloride emulsion (content of silver chloride: 70%; mean grain size of silver chloride: $0.3\mu$; silver content: 1 mole per 1 Kg of emulsion) containing no sensitizing dye or hardening agent was coated to provide a dry thickness of about $3\mu$ on a chromium layer having a thickness of about $1\mu$ electroplated on an aluminum plate having a thickness of 0.2 mm, and then dried to obtain a light-sensitive printing plate material. The light-sensitive printing plate material was processed in the same manner as described in Example 1 to form a resist image, and then plated using a plating solution having the following composition.

| Plating Solution | |
|---|---|
| Copper Sulfate (pentahydrate) | 200 g |
| Sulfuric Acid (98%) | 10 ml |
| Water to make | 1 liter |
| Plating Conditions | |
| Temperature: room temperature (22° C.) | |
| Current Density: 2A/dm² | |
| Time: 30 min. | |

Copper was selectively plated on the chromium layer at the non-silver image area. Finally, the resist remaining was removed by contacting the resist with an aqueous solution of 4 wt% sodium hypochlorite at 50° C. for about 5 minutes to obtain a good printing plate.

EXAMPLE 8

On an iron plate (thickness of 0.2 mm) copper was electroplated to a thickness of about $10\mu$, and then stainless steel (SUS 316, chromium: 18%; nickel: 12%, molybdenum: 2.5%, carbon: 0.06% and iron: 67.44%) was sputtered to a thickness of about $1\mu$ on the copper layer to obtain a support. On this support the same silver halide emulsion as described in Example 5 (except for being free of a hardening agent) was coated to about a 5μ dry thickness to obtain a light-sensitive material

| Sputtering Conditions | |
|---|---|
| High frequency power: | 750 W |
| Distance between electrodes: | 50 mm |
| Argon gas pressure: | 1.2 × 10⁻² Torr |
| Ambient temperature: | 22° C. |
| Sputtering time: | 90 min |

After image exposure in the same manner as described in Example 5 and resist image formation in the same manner as described in Example 1, the printing plate material was immersed in an etching solution having the following composition (24° C., 1 min.).

| Electrolytic Etching Solution | |
|---|---|
| Hydrochloric Acid (36.5%) | 1 part |
| Water | 3 parts |
| Voltage | 6 V.D.C. |
| Cathode | Stainless steel |
| Anode | The printing plate material |

The stainless steel layer at the non-image area was etched away to uncover the copper layer thereunder. Then, the resist remaining at the silver image area was removed in the same manner as described in Example 1 to obtain a good printing plate comprising a copper image area and a stainless steel nonimage area.

While the invention has been described in detail and with reference to specific embodiments thereof, it will be apparent to one skilled in the art that various changes and modifications can be made therein without departing from the spirit and scope thereof.

What is claimed is:

1. A method for producing a multi-layer printing plate consisting essentially of image-wise exposing and tanning developing a light-sensitive printing plate material which comprises a support with an oleophilic surface having thereon a hydrophilic metal layer having thereon at least one silver halide emulsion layer comprising a silver halide and a water-soluble binder, either directly or on at least one subbing layer on the hydrophilic metal layer to thereby form hardened silver image areas and unhardened non-silver image areas; removing the unhardened areas by washing with water; baking the hardened silver image areas to render them a water impermeable resist image, removing said hydrophilic metal layer at the non-resist image areas by etching and then removing the resist image.

2. The method of claim 1, wherein said support having an oleophilic surface is a layer of a metal selected from the group consisting of zinc, iron, silver and brass.

3. The method of claim 1, wherein said hydrophilic metal layer provided on said support having an oleophilic surface is a metal selected from the group consisting of chromium, nickel and stainless steel.

4. The method of claim 1, wherein the thickness of said hydrophilic metal layer provided on said support having an oleophilic surface ranges from about 0.1 to about 10μ.

5. The method of claim 4, wherein said thickness of the hydrophilic metal layer is from about 0.2 to about 5μ.

6. The method of claim 1, wherein said support having an oleophilic surface is a layer of a metal selected from the group consisting of copper, zinc, silver and brass provided on a layer of a metal other than copper, zinc, silver or brass.

7. The method of claim 6, wherein said metal other than copper, zinc, silver or brass is iron, aluminum or stainless steel.

8. The method of claim 6, wherein the thickness of the layer of copper, zinc, silver or brass is from about 1 to about 30μ.

9. The method of claim 1, wherein said silver halide emulsion layer comprises silver chloride, silver bromide, silver iodide, silver chlorobromide, silver chloroiodide, silver iodobromide, silver chloroiodobromide, or a mixture thereof.

10. The method of claim 9, wherein said silver halide emulsion is an emulsion containing about 90 mole% or more silver bromide and not more then about 5 mole% silver iodide, wherein the mean grain size of the silver halide grains is not more than about 3μ and wherein the weight ratio of the silver halide to the water-soluble binder of the emulsion is about 1:4 to about 6:1.

11. The method of claim 9, wherein said silver halide emulsion is an emulsion containing about 90 mole% or more silver bromide and not more than about 5 mole % silver iodide, wherein the mean grain size of the silver halide grains is not more than about 0.1μ and wherein the weight ratio of the silver halide to the water-soluble binder of the emulsion is about 1:4 to about 6:1.

12. The method of claim 9, wherein said silver halide emulsion is an emulsion containing about 50 mole % silver chloride and the mean grain size of the silver halide grains is not more than about 3μ, and wherein the weight ratio of the silver halide to the water-soluble binder of the emulsion is about 1:4 to about 6:1.

13. The method of claim 9, wherein said silver halide emulsion layer has a thickness of about 0.3 to about 20μ.

14. The method of claim 9, wherein said silver halide emulsion layer contains as a binder one or more materials selected from the group consisting of gelatin, gelatin derivatives and synthetic polymer substances.

15. The method of claim 14, wherein said gelatin is at least one material selected from the group consisting of alkali-treated gelatin, acid-treated gelatin and enzyme-treated gelatin.

16. The method of claim 1, wherein said subbing layer is a layer containing one or more materials selected from the group consisting of gelatin, gelatin derivatives and synthetic polymer substances having a dry thickness of about 0.05 to about 3μ.

17. The method of claim 16, wherein said gelatin is at least one material selected from the group consisting of alkali-treated gelatin, acid-treated gelatin and enzyme-treated gelatin.

18. The method of claim 1, wherein said image-wise exposure is conducted using electromagnetic radiation having a wavelength from about 290 to about 750 nm.

19. The method of claim 1, wherein said baking is conducted in an oxygen-containing gas at a temperature not less than about 150° C. and not more than the softening point or deformation point of the support or metal layer provided thereon.

20. The method of claim 19, wherein said baking is in air at about 250° C. to about 600° C. or to the softening point or deformation point of the hydrophilic metal layer when the softening point or deformation point is less than about 600° C.

21. The method of claim 20, wherein said baking is in a mixture of gases containing about 5 to about 40 mole % oxygen.

22. The method of claim 1, wherein the formation of the oleophilic metal layer at non-resist image areas is by removing the hydrophilic metal layer at the non-resist image areas to uncover the oleophilic metal layer thereunder.

23. The method of claim 22, wherein the removal of the hydrophilic metal layer is by applying an aqueous solution containing at least one compound at a concentration of about 5 to about 70% by weight selected from the group consisting of hydrochloric acid, nitric acid, sulfuric acid, phosphoric acid, ferric chloride, aluminum chloride, zinc chloride, sodium perchlorate, potassium perchlorate, cerium (IV) nitrate, cerium (IV) sulfate, ammonium cerium (IV) sulfate and ammonium cerium (IV) nitrate.

24. The method of claim 22, wherein the removal of the hydrophilic metal layer is by ion-etching.

25. The method of claim 1, wherein the removal of the resist image is by applying an aqueous solution of at least one compound at a concentration of about 10 to about 70% by weight selected from the group consisting of sodium hydroxide, potassium hydroxide, sodium hypochlorite, potassium hypochlorite, sulfuric acid, nitric acid, and hydrochloric acid.

26. The method of claim 1, wherein the water used to remove the unhardened areas is at about 30° to about 60° C.

27. The method as described in claim 1, wherein the thickness of said hydrophilic metal layer provided on said support having an oleophilic surface ranges from about 0.1 to about 10μ.

28. The method of claim 27, wherein said subbing layer is a layer containing one or more materials selected from the group consisting of gelatin, gelatin derivatives and synthetic polymer substances having a dry thickness of about 0.05 to about 3μ.

29. A method for producing a multi-layer printing plate consisting essentially of image-wise exposing and developing a light-sensitive printing plate material which comprises a support with an oleophilic metal surface having thereon a hydrophilic metal layer having thereon at least one silver halide emulsion layer comprising a silver halide and a water soluble binder, either directly or on at least on subbing layer on the hydrophilic metal layer, fixing the developed material having a silver image, baking the thus obtained material to remove the emulsion layer at the silver image area to leave a binderless silver image at the silver image area and to form a water impermeable resist image for metal etching at the non-image area, removing the binderless silver image, removing said hydrophilic metal layer at the non-resist image areas by etching, and then removing the resist image.

30. The method of claim 29, wherein the removal of the binderless silver image is by applying an aqueous solution containing at least one compound selected from the group consisting of hydrogen peroxide; sodium, potassium, or ammonium peroxodisulfate, sodium ferricyanide, potassium ferricyanide, sodium dichromate, potassium dichromate, ammonium dichromate, sodium permanganate and potassium permanganate, which further comprises at least one compound selected from the group consisting of copper (II) chloride, copper (II) bromide, copper (II) nitrate, copper (II) sulfate, copper (II) citrate, iron (III) chloride and iron (III) sulfate.

31. The method of claim 30, wherein the aqueous solution further contains at least one compound selected from the group consisting of acetic acid, tartaric acid, citric acid, lactic acid, sulfuric acid, hydrochloric acid, nitric acid, phosphoric acid, potassium bromide, potassium chloride, sodium bromide, sodium chloride, sodium tartrate, potassium tartrate, sodium citrate and potassium citrate at a concentration of about 0.05 to about 50% by weight.

32. The method of claim 29, wherein the removal of the binderless silver image is attained at the same time as the removal of the hydrophilic metal layer thereunder.

33. The method of claim 32, wherein the removal of the binderless silver image and the hydrophilic metal layer thereunder is by applying an aqueous solution containing at least one compound selected from the group consisting of hydrochloric acid, nitric acid, sulfuric acid, phosphoric acid, iron (III) chloride, aluminum chloride, zinc chloride, sodium perchlorate, potassium perchlorate, cerium (IV) nitrate, cerium (IV) sulfate, ammonium cerium (IV) sulfate and ammonium cerium (IV) nitrate at a concentration of about 5 to 70% by weight.

34. The method of claim 29, wherein said support having an oleophilic surface is a layer of a metal selected from the group consisting of zinc, iron, silver and brass.

35. The method of claim 29, wherein said hydrophilic metal layer provided on said support having an oleophilic surface is a metal selected from the group consisting of chromium, nickel and stainless steel.

36. The method of claim 29, wherein said gelatin is at least one material selected from the group consisting of alkali-treated gelatin, acid-treated gelatin and enzyme-treated gelatin.

37. The method of claim 36, wherein said image-wise exposure is conducted using electromagnetic radiation having a wavelength from about 290 to about 750 nm.

38. The method of claim 36, wherein said baking is conducted in an oxygen-containing gas at a temperature not less than about 150° C. and not more than the softening point or deformation point of the support or the metal layer provided thereon.

39. The method of claim 29, wherein said baking is in air at about 250° C. to about 600° C. or to the softening point or deformation point of the hydrophilic metal layer when the softening point or deformation point is less than about 600° C.

40. The method of claim 39, wherein said baking is in a mixture of gases containing about 5 to about 40 mole % oxygen.

41. The method of claim 39, wherein said silver halide emulsion is an emulsion containing about 90 mole% or more silver bromide and not more than about 5 mole % silver iodide, wherein the mean grain size of the silver halide grains is not more than about 0.1μ and wherein the weight ratio of the silver halide to the water-soluble binder of the emulsion is about 1:4 to about 6:1.

42. The method of claim 39, wherein said silver halide emulsion is an emulsion containing about 50 mole % silver chloride and the mean grain size of the silver halide grains is not more than about 3μ, and wherein the weight ratio of the silver halide to the water-soluble binder of the emulsion is about 1:4 to about 6:1.

43. The method of claim 39, wherein said silver halide emulsion layer has a thickness of about 0.3 to about 20μ.

44. The method of claim 39, wherein said silver halide emulsion layer contains as a binder one or more materials selected from the group consisting of gelatin, gelatin derivatives and synthetic polymer substances.

45. The method of claim 44, wherein said gelatin is at least one material selected from the group consisting of alkali-treated gelatin, acid-treated gelatin and enzyme-treated gelatin.

46. The method of claim 29, wherein said thickness of the hydrophilic metal layer is from about 0.2 to about 5μ.

47. The method of claim 46, wherein said support having an oleophilic surface is a layer of a metal selected from the group consisting of copper, zinc, silver and brass provided on a layer of a metal other than copper, zinc, silver or brass.

48. The method of claim 47, wherein said metal other than copper, zinc, silver or brass is iron, aluminum or stainless steel.

49. The method of claim 47, wherein the thickness of the layer of copper, zinc, silver or brass is from about 1 to about 30μ.

50. The method of claim 49 wherein said silver halide emulsion layer comprises silver chloride, silver bromide, silver iodide, silver chlorobromide, silver chloroiodide, silver iodobromide, silver chloroiodobromide, or a mixture thereof.

51. The method of claim 50, wherein said silver halide emulsion is an emulsion containing about 90 mol% or more silver bromide and not more than about 5 mole% silver iodide, wherein the mean grain size of the silver halide grains is not more than about 3μ and wherein the weight ratio of the silver halide to the water-soluble binder of the emulsion is about 1:4 to about 6:1.

52. The method of claim 29, wherein the formation of the oleophilic metal layer at non-resist image areas is by removing the hydrophilic metal layer at the non-resist image areas to uncover the oleophilic metal layer thereunder.

53. The method of claim 52, wherein the removal of the hydrophilic metal layer is by applying an aqueous solution containing at least one compound at a concentration of about 5 to about 70% by weight selected from the group consisting of hydrochloric acid, nitric acid, sulfuric acid, phosphoric acid, ferric chloride, aluminum chloride, zinc chloride, sodium perchlorate, potassium perchlorate, cerium (IV) nitrate, cerium (IV) sulfate, ammonium cerium (IV) sulfate and ammonium cerium (IV) nitrate.

54. The method of claim 52, wherein the removal of the hydrophilic metal layer is by ion-etching.

55. The method of claim 29, wherein the removal of the resist image is by applying an aqueous solution of at least one compound at a concentration of about 10 to about 70% by weight selected from the group consisting of sodium hydroxide, potassium hydroxide, sodium hypochlorite, potassium hypochlorite, sulfuric acid, nitric acid, and hydrochloric acid.

* * * * *